United States Patent
Pfeiffer et al.

(10) Patent No.: US 6,859,411 B2
(45) Date of Patent: Feb. 22, 2005

(54) CIRCUIT AND METHOD FOR WRITING AND READING DATA FROM A DYNAMIC MEMORY CIRCUIT

(75) Inventors: Johann Pfeiffer, Ottobrunn (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 10/623,831

(22) Filed: Jul. 21, 2003

(65) Prior Publication Data

US 2004/0027975 A1 Feb. 12, 2004

(30) Foreign Application Priority Data

Jul. 19, 2002 (DE) .......................................... 102 32 962

(51) Int. Cl.[7] ................................................. G11C 8/00
(52) U.S. Cl. ...................... 365/230.06; 365/20; 365/63
(58) Field of Search ........................... 365/230.06, 220, 365/63, 189.01, 230.08, 238.5

(56) References Cited

U.S. PATENT DOCUMENTS 5,896,331 A * 4/1999 Crafts ........................ 365/201
6,208,563 B1 * 3/2001 Naritake ................. 365/189.05
2003/0086325 A1 * 5/2003 Lee et al. .................... 365/222

OTHER PUBLICATIONS

Sugibayashi, T. et al.: "A 30–ns 256–Mb DRAM with a Multidivided Array Structure", IEEE Journal of Solid-State Circuits, vol. 28, No. 11, Nov. 1993, pp. 1092–1098.

* cited by examiner

Primary Examiner—Richard Elms
Assistant Examiner—Dang T Nguyen
(74) Attorney, Agent, or Firm—Laurence A. Greenberg; Werner H. Stemer; Gregory L. Mayback

(57) ABSTRACT

A method for writing and reading data is performed on a dynamic memory circuit. The memory circuit has memory cells that can be addressed via word lines and bit lines. A word line is activated in the event of addressing of a memory area with a specific address. A word line has a plurality of mutually separate word line sections. Via the bit lines, in the event of addressing with the specific address, in parallel, a first number of data can be written to memory cells addressed by the address or the first number of data can be read from memory cells addressed by the address. In the event of addressing with a specific address, only a portion of the word line sections are activated, in order that only a portion of the memory cells connected to the word line are written to in parallel or read from in parallel.

11 Claims, 1 Drawing Sheet

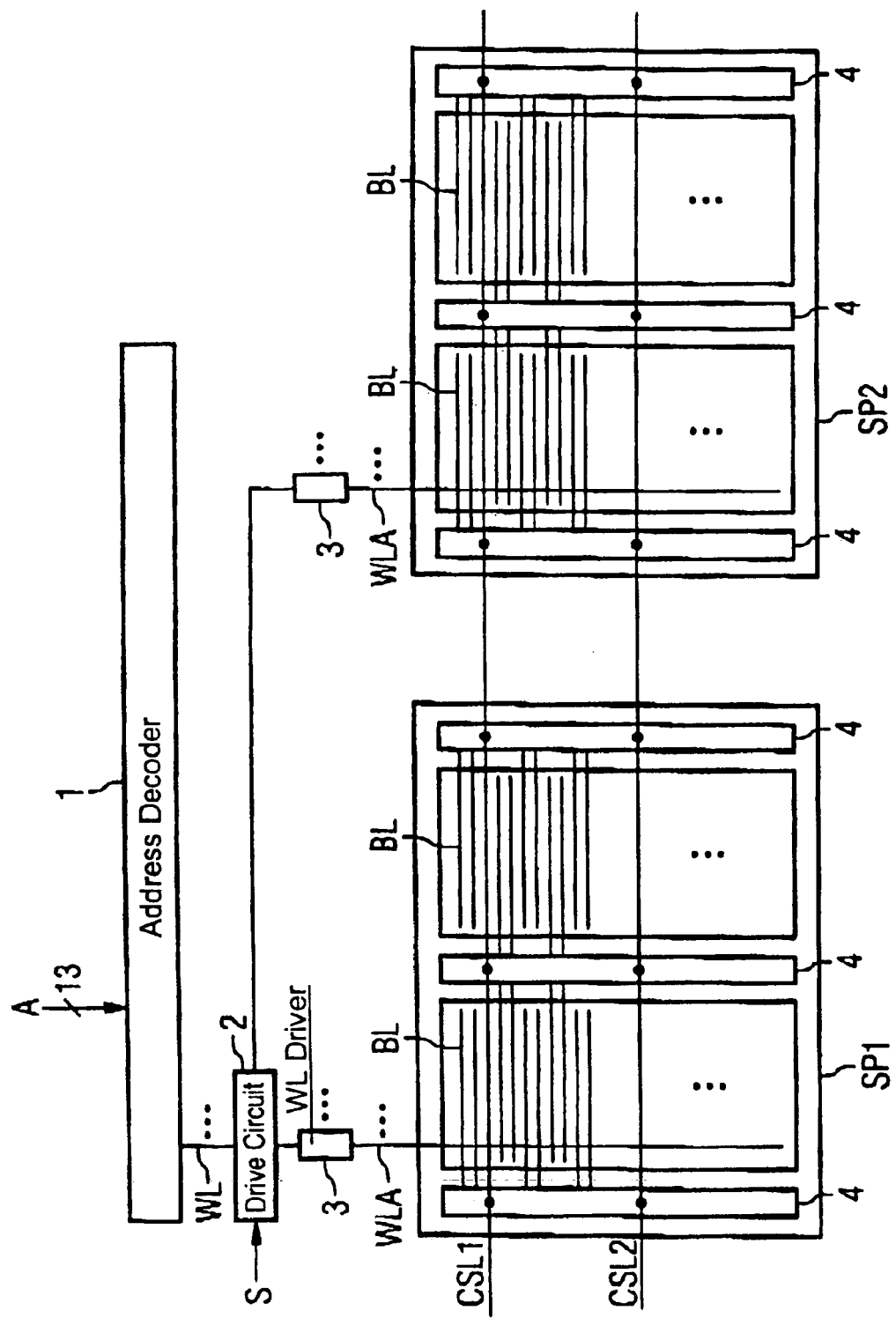

US 6,859,411 B2

CIRCUIT AND METHOD FOR WRITING AND READING DATA FROM A DYNAMIC MEMORY CIRCUIT

BACKGROUND OF THE INVENTION

Field of the Invention

The invention relates to a method for writing and reading data from a dynamic memory circuit. The invention furthermore relates to a circuit for writing and reading data.

A dynamic memory circuit, such as e.g. a DRAM, has word lines and bit lines, with memory cells situated at the crossover points thereof. The memory cells are addressed by a word line at which the memory cell is situated being activated and the datum being read from the memory cell by selection of the corresponding bit line.

In the event of activation of a word line of a DRAM, at the present time it is usually the case that two physical word lines are activated internally. Thus, by way of example a 256M module has 8192 word line addresses, i.e. the address range is defined with 13 bits. However, the 256M module physically has 16,384 word lines, redundant word lines not being taken into account. An addressable word line therefore contains two word line sections which can be addressed via the same address and which can each be driven with a dedicated word line driver. It has the advantage that the length of the word line can essentially be halved, thereby reducing the capacitance of the word line to the capacitances of a word line section. In this way, word lines can be subjected to charge reversal more rapidly, i.e. can be activated and deactivated more rapidly, thereby considerably accelerating the access to a memory cell.

Depending on the configuration of the memory module, 16, 8 or 4 data bits are simultaneously read per clock cycle. In the case of a double data rate module, this number of bits is output with each rising and each falling edge of the clock signal. In order to make the data available, the sense amplifiers are activated with column select lines. A x16 organized memory module outputs 16 bits in each case with a rising edge and the falling edge of the clock signal, so that 32 bits have to be output during one clock cycle. A x16 organized memory module therefore activates four column select lines for a write and read operation, in which case 32 bits of data can be written or read during an access within one clock cycle. In the case of a x8 organized memory module, therefore, only two column select lines are activated, so that 16 bits of data are made available per access, i.e. per clock cycle, of which 8 bits can be accepted or output with the rising edge and 8 bits with the falling edge.

In the case of a x4 organized memory module, however, two memory select lines are likewise activated for writing or reading purposes, so that 16 bits of data can be processed per clock cycle. However, since only 4 bits can be accepted or read simultaneously with each rising edge and with each falling edge, it is possible to use only a portion of the memory area thus activated of 16 bits, namely only 8 bits thereof.

The activation of a word line leads to a power consumption that is caused by charge reversal of the word line but also on account of the sense amplifier thereby activated. What is thus disadvantageous is that the power consumption is just as high in a x4 organized module as it is in a x8 organized module, since even though only 8 bits of data are read per clock cycle, 16 bits of data have to be provided in each case.

The power consumption results from the fact that in the event of activation of the word line, the charge from the memory cells situated thereon flows onto one of the bit lines and the potentials of the bit line or of an adjacent bit line are pulled apart with regard to their potential by the sense amplifiers, i.e. the potential of one of the bit lines is pulled toward a low potential and the potential of the respective other bit line is pulled toward a high potential. Furthermore, power is consumed in order to decode the word line address.

SUMMARY OF THE INVENTION

It is accordingly an object of the invention to provide a circuit and a method for writing and reading data from a dynamic memory circuit that overcomes the above-mentioned disadvantages of the prior art methods and devices of this general type, in which the energy consumption of a dynamic memory module can be reduced.

With the foregoing and other objects in view there is provided, in accordance with the invention, a method for writing and reading data from a dynamic memory circuit. The dynamic memory circuit has memory cells addressed by word lines and bit lines. A word line is activated in an event of addressing of a memory area with a specific address. Each of the word lines has a plurality of mutually separate word line sections, and via the bit lines, in the event of addressing with the specific address, in parallel, a number of data is written to the memory cells addressed by the address or the data is read from the memory cells addressed by the address. The method includes activating only a portion of the word line sections in the event of addressing with the specific address, resulting in only a portion of the memory cells being addressed by the word line and being written to in parallel or read from in parallel.

The invention provides a method for writing and reading data from a dynamic memory circuit. The memory circuit has memory cells that can be addressed via word lines and bit lines. In this case, a word line is activated in the event of addressing of a memory area with a specific address. The word line has a plurality of mutually separate word line sections. Via the bit lines, in the event of addressing with the specific address, in parallel, a number of data can be written to memory cells addressed by the address or can be read from memory cells addressed by the address. It is provided that only a portion of the word line sections are activated in the event of addressing with a specific address, in order that only a portion of the memory cells addressed by the word line are written to in parallel or read from in parallel.

Usually, the word lines are subdivided into a plurality of word line sections, preferably two, and in each case provided with a dedicated word line driver. In each case, in the event of addressing of the word line, the word line drivers are usually driven jointly via the same addressing. When data are being written or read, the sense amplifiers are activated via the column select lines. Depending on the organization of the memory module, i.e. the data bits that can be read simultaneously, a specific number of memory cells are addressed via the column select lines for the purpose of writing or for the purpose of reading. It can happen, however, in particular in the case of a x4 organized memory module, that more memory cells are addressed than can be written to or read from in one clock cycle.

In the event of activation of a word line for addressing a memory cell, the charges of the memory cells situated on the word line flow onto the corresponding bit lines and must be amplified by the sense amplifiers in order that, on the one hand, the charge that has flowed away is written back to the memory cell again and, on the other hand, depending on bit lines selected for the purpose of reading, is applied to the data outputs as readable information. The amplification of the charges on the bit lines requires electrical energy and thus makes a considerable contribution to the current consumption of the memory circuit.

Since the word lines are usually subdivided into two or more word line sections which are physically separate from one another and are each driven by a word line driver, the invention makes provision for not all of the word line sections to be activated when addressing memory cells, in order thus to save the energy necessary for charge separation. This is expedient in particular when only a portion of the memory cells which can only be addressed via one of the word line sections are to be written to or read from in one clock cycle.

This makes it possible to avoid the situation in which the sense amplifiers on a portion of the bit lines have to amplify the charges flowing onto the bit lines from the memory cells, since the word line sections on which memory cells which are not intended to be addressed are located are not activated. As a result, it advantageously becomes possible to reduce the current consumption that is brought about by the activation of a word line and by the charge amplification on the bit lines.

It may be provided that the activation of only a portion of the word line sections is carried out if, at the same time, only a second number of data, which is less than the first number of data, are intended to be written to the memory cells addressed by the address or to be read from the memory cells addressed by the address.

A further aspect of the present invention provides a circuit for writing or reading data from a dynamic integrated memory circuit. The memory circuit has memory cells that can be addressed via word lines and bit lines. The word line is activated in the event of addressing with a specific address, a word line having a plurality of mutually separate word line sections. Via the bit lines, in the event of addressing with the specific address, in parallel, a first number of data can be written to memory cells addressed by the address or data can be read from memory cells addressed by the address. A drive circuit is provided in order to activate only a portion of the word line sections in the event of addressing with a specific address, so that only a portion of the memory cells connected to the word line can be written to in parallel or read from in parallel.

Such a circuit has the advantage that, with the aid of the drive circuit, the word line sections that can usually be addressed jointly via a specific address can now be driven individually if the word line is intended to be activated. As a result, it is possible, according to the invention, to activate only one word line section if data are intended to be addressed only from memory cells situated on this word line section.

It is preferably provided that the drive circuit is activated depending on a control signal of a first word line section and/or of a second word line section of a word line. The control signal is preferably applied to an external terminal of the integrated memory circuit, the external terminal being a control terminal of the integrated memory circuit. An integrated memory module usually has only a limited number of address inputs and data inputs and outputs, so that an additional external terminal for the selection of one of the word line sections is not provided. This would correspond to a further address input. According to the invention, then, it is provided that the control signal is applied to a control terminal of the integrated memory circuit that is used for controlling the read/write operation or the like. This has the advantage that there is no need to add a further external terminal for the integrated memory circuit, rather it is possible to utilize existing terminals.

Other features which are considered as characteristic for the invention are set forth in the appended claims.

Although the invention is illustrated and described herein as embodied in a circuit and a method for writing and reading data from a dynamic memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a block diagram of an integrated memory circuit according to the invention.

DESCRIPTION OF THE PREFERRED EMBODIMENTS

Referring now to the single FIGURE of the drawing in detail, there is shown an integrated memory circuit with a storage capacity of 256 Mbits. The memory circuit is organized into 8192 word lines WL. Non-illustrated memory cells are situated on the word lines WL, and the contents of the memory cells can be read via bit lines BL.

A memory cell is addressed by a procedure in which first the corresponding word line WL that is connected to the memory cell to be addressed is activated. Afterward, the content of a memory cell is read via the bit line BL through a sense amplifier 4. A datum is written to a memory cell by a charge being impressed via a bit line of a memory cell.

In the event of activation of a word line WL, the respective memory transistors of the memory cells situated thereon are activated and the charge of the storage capacitors flows onto the corresponding bit lines BL. The sense amplifiers 4 on the corresponding bit lines BL amplify the small difference in charge with respect to an adjacent bit line BL not connected to a storage capacitor. A column select signal CSL is used to select the sense amplifiers 4 from which the datum is intended to be output onto the corresponding data line or via which the addressed memory cell is intended to be written to.

In the case of a double data rate memory, data are transferred in the memory cells or from the memory cells with the rising edge of the clock signal and the falling edge of the clock signal. As a result, the data transfer rate is increased compared with conventional memory circuits. In a memory module having data inputs/outputs with a data bus width of 8 bits, it is thus possible to transfer 16 bits per clock cycle. Correspondingly, in the case of a memory module having a data bus width of 4 bits, 8 bits are transferred per clock cycle. However, both in the case of a memory module having an 8-bit data bus and in the case of a memory module having a 4-bit data bus, two column select lines are activated in the event of addressing. These are usually stipulations that result from the specification of the memory circuit.

In memory modules, it is important that the memory cells can be written to and read from again relatively rapidly. In the case of large memory blocks, in particular, the word lines WL would therefore take up a large length, resulting in considerable charge reversal times in the event of activation of the word lines WL, on account of the line capacitance. For this reason, provision is made of word lines WL with two or more sections that can each be operated with a dedicated word line driver 3 thereby considerably reducing the time for charge reversal of the word line WL, i.e. of the individual word line sections.

The consequence of this is that provision is made of a plurality of memory areas SP1, SP2 each having a word line WL that can be addressed via the same address. Each of the memory areas is connected to the same column select lines CSL, so that the sense amplifiers 4 in each of the memory areas are activated via the same column select signals CSL. As a result, in a memory circuit whose word lines WL each have two word line sections WLA, sense amplifiers in both memory areas are activated by one column select line CSL, and 8 bits of data are addressed with each read operation or write operation. In the event of the activation of two column select lines CSL for writing or reading data into the memory cells, this results in 16 bits of data being provided in the event of reading, and 16 memory cells being addressed for the purpose of writing data. Particularly in the case of a 4-bit data bus, however, it is possible to transfer only a maximum of 8 bits of data (with double data rate) per clock cycle. If data are then read, 16 bits of data that could be read are ready, however, with each clock cycle. However, only 8 bits of the 16 bits of data are selected and output. The remaining 8 bits are discarded.

The amplification of charges on the bit lines BL requires a considerable amount of electrical energy, since a large number of memory transistors are opened with the activation of a word line, so that the charge flows from the storage capacitors onto the respective bit lines BL. The sense amplifiers connected thereto amplify the charge and make it available at an output of the sense amplifier, even if they are not tapped off there. The large number of bit lines results in that this operation requires a great deal of energy, even when the data present at the output of the sense amplifier are not used.

According to the invention, then, it is provided that the word line sections WLA can be driven separately from one another, so that only one or a portion of the word line sections WLA is activated in each case. Energy is thus saved by not activating a word line section WLA that would normally be activated in the event of addressing of a word line WL. This avoids the situation in which the sense amplifiers 4 have to amplify the potential differences on the corresponding bit lines. This saves a considerable amount of energy that is normally consumed through the provision of the data on the bit lines. As a result, the current consumption of the integrated memory circuit is reduced, as a result of which, by way of example, the chip is heated to a lesser extent.

The exemplary memory module has 8192 logical word lines. These can be addressed via address inputs with an address bus width of 13 bits. The selection of the respective word line WL is performed by an address decoder 1. The address decoder 1 has 8192 outputs connected to the respective addressed word lines WL. According to the invention, then, each of the outputs of the address decoder 1 is connected to a drive circuit 2 having a control input for a control signal S and two outputs for a respective word line drive signal. The two outputs for the word line drive signal are respectively connected to a word line section WLA via a word line driver 3.

Under the control of the control signal S, then, it is provided that, as soon as a word line WL is to be activated by the address decoder 1, the control signal S selects the word line section WLA on which lie the memory cells from which data are to be read or to which data are to be written. The respective other word line section is not activated.

The drive circuit 2 may be configured such that it is also possible for more than two word line sections WLA to be activated individually or partly in a manner controlled by a control signal.

An integrated memory circuit has only a specific number of external terminals. These include the address inputs, the data inputs/outputs and specific control signals. Thus, no provision is made of a further terminal that makes it possible to address the individual word line sections, i.e. to decide which of the word line sections WLA is to be respectively activated and which is to remain deactivated. In this respect, it is provided that a control terminal that is not required during the addressing of memory cells is used to select the word line sections WLA.

This can be carried out with the aid of a data mask (DM) terminal. The DM terminal of a memory module serves to ensure that a read operation that has already begun is not brought to an end, by the data that are to be read being masked, i.e. not applied to the data bus. The DM terminal is normally used only in the event of a column access in order to mask individual data. Of course, it is also possible to use other control terminals for selecting the respective word line section WLA. It is necessary merely to involve a control terminal that is essentially not used during the activation of the word line until the time when the word line WL is deactivated.

The apparatus according to the invention and the method according to the invention can be employed whenever more data than can or are intended to be written or read at the same time are provided with a memory access. It furthermore affords the possibility of providing a low-power memory module since a considerable power saving is achieved during operation of the memory module, by avoiding the situation in which too many sense amplifiers amplify the bit line potentials even though the data are not required.

We claim:

1. A method for writing and reading data from a dynamic memory circuit, the dynamic memory circuit having memory cells addressed by word lines and bit lines, a word line being activated in an event of addressing of a memory area with a specific address, each of the word lines having a plurality of mutually separate word line sections, and via the bit lines, in the event of addressing with the specific address, in parallel, a number of data being able to be written to the memory cells addressed by the address or the data being able to be read from the memory cells addressed by the address, which comprises the step of:
    activating only a portion of the word line sections in the event of addressing with the specific address, resulting in only a portion of the memory cells being addressed by the word line and being written to in parallel or read from in parallel.

2. The method according to claim 1, which further comprises carrying out an activation of only a portion of the word lines if, at a same time, only a second number of the data, which is less than a first number of the data, are intended to be written to the memory cells addressed by the address or to be read from the memory cells addressed by the address.

3. The method according to claim 1, which further comprises writing-in in parallel or reading-out in parallel eight bits of data in the event of addressing of the word line with an address.

4. The method according to claim 1, which further comprises writing-in or reading-out the data to/from the memory cells in the event of a rising and a falling edge.

5. A circuit for writing and reading data from a dynamic integrated memory circuit, the dynamic integrated memory circuit having memory cells addressed by word lines and bit lines, a word line being activated in an event of addressing with a specific address, the word line having a plurality of mutually separate word line sections, via the bit lines, in the event of addressing with the specific address, in parallel, a first number of data being able to be written to memory cells addressed by the addressing or being able to be read from the memory cells addressed by the address, the circuit comprising:

- a drive circuit for activating only a portion of the word line sections in the event of addressing with the specific address, so that only a portion of the memory cells connected to the word line can be written to in parallel or read from in parallel.

6. The circuit according to claim 5, wherein said drive circuit activates only a portion of the word line sections or all the word line sections of the word line, in dependence on a control signal.

7. The circuit according to claim 6, wherein the control signal can be applied to an external terminal of the dynamic integrated memory circuit, the external terminal being a control terminal of the dynamic integrated memory circuit.

8. The circuit according to claim 5, wherein each of the word lines has two of the word line sections.

9. An integrated memory circuit, comprising:

- word lines having a plurality of mutually separate word line sections;
- bit lines;
- memory cells connected to and addressed by said word lines and said bit lines, a word line being activated in an event of addressing with a specific address, and through said bit lines, in the event of addressing with the specific address, in parallel, a first number of data being able to be written to said memory cells addressed by the addressing or being able to be read from said memory cells addressed by the address; and
- a drive circuit connected to said word lines and activating only a portion of said word line sections in the event of addressing with the specific address, so that only a portion of said memory cells connected to said word line can be written to in parallel or read from in parallel.

10. A method for writing and reading data from a dynamic memory circuit, the dynamic memory circuit having memory cells addressed by word lines and bit lines, a word line being activated in an event of addressing of a memory area with a specific address, each of the word lines having a plurality of mutually separate word line sections, and via the bit lines, in the event of addressing with the specific address, in parallel, a number of data being able to be written to the memory cells addressed by the address or the data being able to be read from the memory cells addressed by the address, which comprises the step of:

- applying a control signal to a control terminal of the integrated memory for activating only a portion of the word line sections in the event of addressing with the specific address, resulting in only a portion of the memory cells being addressed by the word line and being written to in parallel or read from in parallel.

11. The method according to claim 10, which further comprises using a terminal of the integrated memory that is not an address terminal or a data terminal as the control terminal.

* * * * *